United States Patent
Schaeffer et al.

(10) Patent No.: US 12,363,961 B2
(45) Date of Patent: Jul. 15, 2025

(54) SEMICONDUCTOR DEVICE

(71) Applicant: Infineon Technologies AG, Neubiberg (DE)

(72) Inventors: Carsten Schaeffer, Annenheim (AT); Patrick Hanekamp, Laaber (DE); Oliver Humbel, Maria Elend (AT); Angelika Koprowski, Klagenfurt (AT); Wolfgang Lehnert, Lintach (DE); Francisco Javier Santos Rodriguez, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 744 days.

(21) Appl. No.: 17/526,490

(22) Filed: Nov. 15, 2021

(65) Prior Publication Data

US 2023/0154978 A1 May 18, 2023

(51) Int. Cl.
*H10D 62/10* (2025.01)
*H01L 21/02* (2006.01)
*H10D 64/00* (2025.01)

(52) U.S. Cl.
CPC ...... *H10D 62/112* (2025.01); *H01L 21/02118* (2013.01); *H01L 21/0217* (2013.01); *H01L 21/0228* (2013.01); *H10D 64/111* (2025.01)

(58) Field of Classification Search
CPC ............. H01L 29/0611; H01L 29/0661; H01L 29/7808; H01L 29/7821; H01L 29/7811; H01L 29/7823; H01L 29/0638; H01L 21/02118; H01L 21/0217; H01L 21/0228; H01L 29/402; H01L 23/291; H01L 23/3171; H01L 23/3192; H10D 62/112; H10D 64/111; H10D 8/411; H10D 62/126; H10D 62/8325; H10D 62/8503; H10D 64/112; H10D 62/106; H10D 62/105

See application file for complete search history.

(56) References Cited

U.S. PATENT DOCUMENTS 5,578,103 A 11/1996 Araujo et al.
6,589,886 B2 7/2003 Kim et al.
(Continued)

FOREIGN PATENT DOCUMENTS

DE 102013111452 A1 4/2014
DE 102014119360 A1 6/2015
(Continued)

OTHER PUBLICATIONS

Stefan Krivec, et al., "On the temperature dependence of Na Migration in thin SiO2 Films during ToF-SIMS O2+ depth profiling", Applied Surface Science, vol. 257, 2010, pp. 25-32.
(Continued)

*Primary Examiner* — Eduardo A Rodela
(74) *Attorney, Agent, or Firm* — Cooper Legal Group LLC

(57) ABSTRACT

A semiconductor device and a method of forming a semiconductor device are provided. In an embodiment, the semiconductor device comprises a device region, an edge termination region surrounding the device region, a first metal feature in the edge termination region, a first conformal ion diffusion barrier layer over the first metal feature, and a first conformal chemical protection layer over the first conformal ion diffusion barrier layer.

26 Claims, 6 Drawing Sheets

(56) References Cited

U.S. PATENT DOCUMENTS

| | | | |
|---|---|---|---|
| 8,618,582 B2* | 12/2013 | Henning | H01L 29/0619 257/454 |
| 8,686,469 B2* | 4/2014 | Nakamura | H01L 29/0619 257/143 |
| 11,133,492 B2* | 9/2021 | Li | H01M 10/0436 |
| 11,211,303 B2* | 12/2021 | Konrath | H01L 29/7811 |
| 11,942,512 B2* | 3/2024 | Furukawa | H02M 7/5387 |
| 11,949,007 B2* | 4/2024 | Nakamura | H01L 29/8611 |
| 2005/0098812 A1 | 5/2005 | Yang et al. | |
| 2010/0252800 A1* | 10/2010 | Chidambarrao | H01L 29/0665 977/762 |
| 2012/0012166 A1 | 1/2012 | Atanackovic et al. | |
| 2013/0220410 A1* | 8/2013 | Haas | C23C 16/345 438/57 |
| 2013/0247972 A1 | 9/2013 | Mungekar et al. | |
| 2015/0357302 A1* | 12/2015 | Chen | H01L 25/105 257/737 |
| 2019/0267451 A1* | 8/2019 | Araoka | H01L 21/02255 |
| 2022/0140132 A1* | 5/2022 | Van Brunt | H01L 29/0623 257/77 |

FOREIGN PATENT DOCUMENTS

| | | |
|---|---|---|
| DE | 102017113515 A1 | 12/2018 |
| DE | 102018111231 A1 | 11/2019 |

OTHER PUBLICATIONS

Stefan Krivec, et al., "The effect of bias-temperature stress on Na+ incorporation into thin insulating films", Analytical and Bioanalytical Chemistry, 2011, pp. 649-657.

* cited by examiner

SEMICONDUCTOR DEVICE

TECHNICAL FIELD

The present disclosure relates to semiconductor devices, for example, semiconductor devices with a high breakthrough voltage, and manufacturing methods therefore.

BACKGROUND

Semiconductor devices include an edge termination structure to reduce electric field gradients at an edge of the semiconductor device.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a semiconductor device is provided. The semiconductor device comprises a device region, an edge termination region surrounding the device region, a first metal feature in the edge termination region, a first conformal ion diffusion barrier layer over the first metal feature, and a first conformal chemical protection layer over the first conformal ion diffusion barrier layer.

According to some embodiments, a semiconductor device is provided. The semiconductor device comprises a device region, an edge termination region adjacent the device region, a first metal feature in the edge termination region, a first atomic layer deposition layer having a first material composition over the first metal feature, and a second atomic layer deposition layer having a second material composition different than the first material composition over the first atomic layer deposition layer.

According to some embodiments, a method for forming a semiconductor device is provided. The method comprises forming a first conformal layer having a first material composition and a first thickness less than 200 nm over a first metal feature formed in an edge termination region of the semiconductor device. A second conformal layer having a second material composition different than the first material composition and a second thickness less than 200 nm is formed over the first conformal layer. A conformal dielectric layer is formed over the second conformal layer. A polymer layer is formed over the conformal dielectric layer.

According to some embodiments, an apparatus is provided. The apparatus includes means for forming a semiconductor device. The apparatus comprises means for forming a first conformal layer having a first material composition and a first thickness less than 200 nm over a first metal feature formed in an edge termination region of the semiconductor device. The apparatus comprises means for forming a second conformal layer having a second material composition different than the first material composition and a second thickness less than 200 nm over the first conformal layer. The apparatus comprises means for forming a conformal dielectric layer over the second conformal layer. The apparatus comprises means for forming a polymer layer over the conformal dielectric layer.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1A:
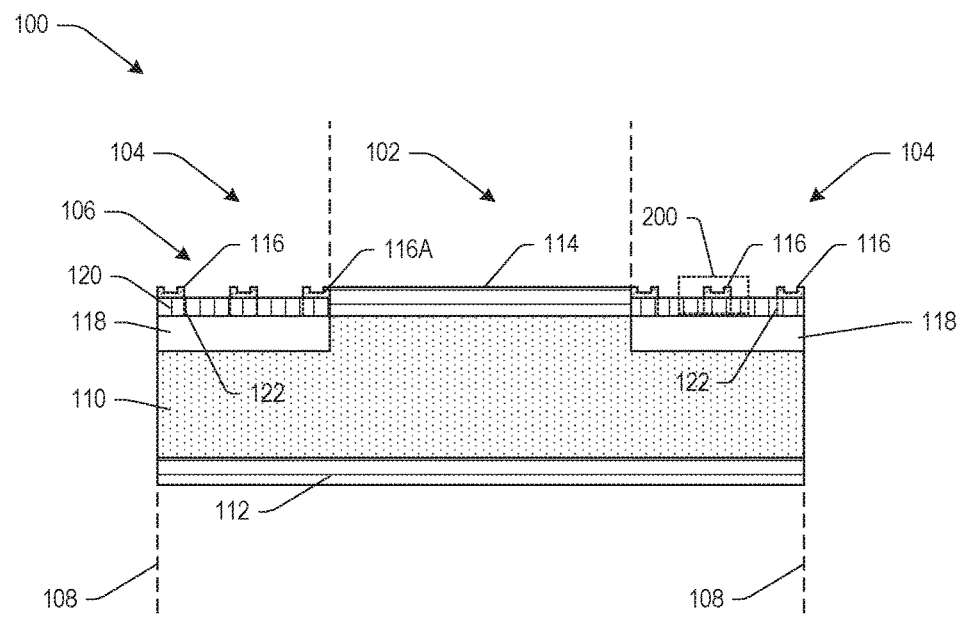
FIG. 1A is a cross-sectional view of a semiconductor device, according to various examples.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an off-axis angle of at most 8° (or at most 6° or at most 4°) with the main extension plane. The first or main horizontal side can be for instance the surface of a wafer or a die. Sometimes, the horizontal direction is also referred to as the lateral direction.

The material of the semiconductor substrate may have hexagonal crystal structure, such as seen in a silicon carbide material, for example. In some embodiments, the material of the semiconductor substrate has a cubic crystal structure not having an off-axis angle, such as seen in a silicon material, for example.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

The Figures illustrate relative doping dosages by indicating "−" or "+" next to the doping type "n" or "p". For example, "n−" means a doping dosage which is lower than the doping dosage of an "n"-doping region while an "n+"-doping region has a higher doping dosage than an "n"-doping region. Doping regions of the same relative doping dosage do not necessarily have the same absolute doping dosage. For example, two different "n"-doping regions may have the same or different absolute doping dosages.

In accordance with the present disclosure, a semiconductor device and a method of manufacturing the semiconductor device are provided. The semiconductor device may comprise doped semiconductor material formed in trenches and over a mesa defined between adjacent trenches. The doping profile of the semiconductor material may be varied to affect the forward current and leakage current of the device.

According to some embodiments, a semiconductor device is provided. The semiconductor device comprises a device region, an edge termination region surrounding the device region, a first metal feature in the edge termination region, a first conformal ion diffusion barrier layer over the first metal feature, and a first conformal chemical protection layer over the first conformal ion diffusion barrier layer.

The embodiments described herein may be combined in any way.

Figure 1B:
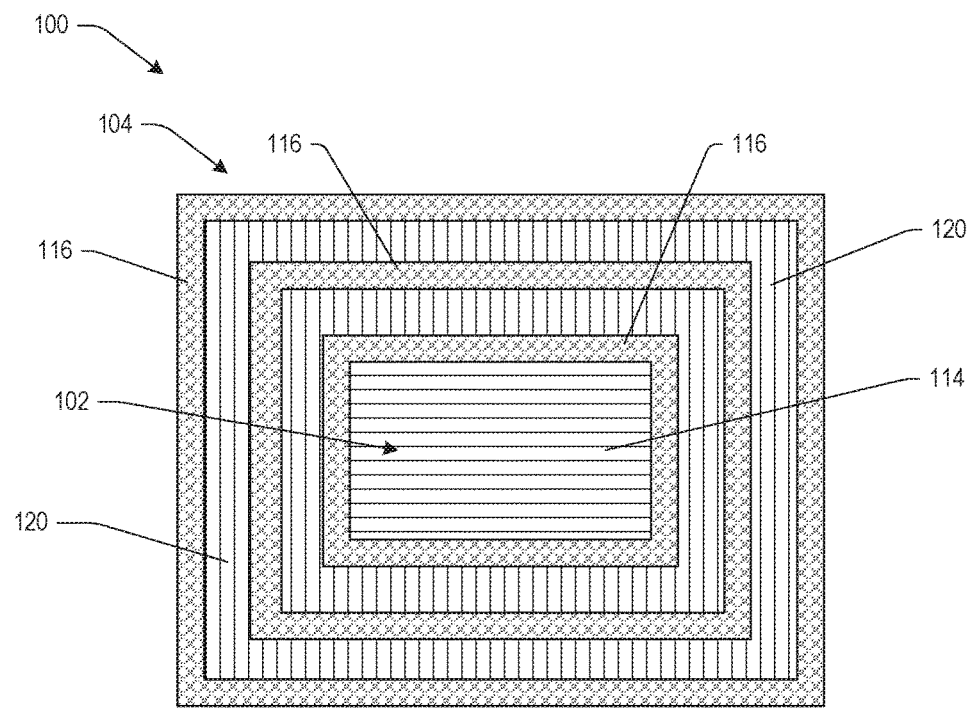
FIG. 1B is a top view of a semiconductor device, according to various examples.

FIGS. 1A and 1B illustrate a cross-sectional view and a top view of a semiconductor device 100, respectively, according to various examples of the present disclosure. In some embodiments, the semiconductor device 100 comprises a device region 102 and an edge termination region 104. In some embodiments, one or more functional devices (not shown), such as a diode, transistor, or some other device, is formed in the device region 102. The one or more devices in the device region 102 may comprise high voltage devices, having operating voltages greater than 200V, greater than 400V, greater than 600V, greater than 1.2 kV, or even greater than 2 kV. The edge termination region 104 comprises an edge termination structure 106 that serves to reduce electric field gradients at an edge 108 of the semiconductor device 100. In some embodiments, the semiconductor device 100 comprises a semiconductor body 110 in which the one or more functional devices are formed, and contacts 112, 114 that serve as terminals of the one or more functional devices. Other structures and configurations of the contacts 112, 114, are within the scope of the present disclosure.

In some embodiments, the semiconductor body 110 comprises crystalline semiconductor material. The semiconductor body 110 may comprise silicon, silicon carbide (SiC), and/or other semiconductor compounds. The semiconductor body 110 may comprise dopants (e.g., nitrogen (N), phosphorus (P), beryllium (Be), boron (B), aluminum (Al), gallium (Ga) and/or other dopants). Alternatively and/or additionally, the semiconductor body 110 may comprise impurities (e.g., hydrogen, fluorine, oxygen and/or other impurities). The semiconductor body 110 may comprise a hexagonal phase of silicon carbide, e.g., 4H—SiC, or a cubic phase of silicon. For a hexagonal phase, the <0001> crystal axis may be tilted by an off-axis angle α to a surface normal the first surface. The <11-20> crystal axis may be tilted by the off-axis angle α with respect to the horizontal plane. The <1-100> crystal axis may be orthogonal to the cross-sectional plane. The off-axis angle α may be in a range from 2° to 8°. For example, the off-axis angle α may be 4°.

In some embodiments, the semiconductor body 110 comprises a substrate portion and a drift layer (not separately illustrated) formed using an epitaxial growth process using the substrate portion as a growth template. The semiconductor body 110 may be a semiconductor material, such as SiC (e.g. having a hexagonal crystal structure), GaN, $Ga_2O_3$, diamond, InP, AlP, a ternary group III-V semiconductor, such as AlGaN, InGaN, InGaP, InAlP, or some other suitable material alone or in combination. In some embodiments, the semiconductor body 110 has a band gap of about 2.4 eV to 3.4 eV. In some embodiments, the semiconductor body 110 has a band gap greater than 2 eV (a so-called wide band gap semiconductor). In some embodiments, the semiconductor body 110 comprises an n-type impurity, such as at least one of phosphorous, arsenic, or another suitable n-type dopant provided at an n-dosage.

In some embodiments, the edge termination structure 106 comprises one or more metal features 116 and a doped feature 118 defined in the semiconductor body 110. In some embodiments, a dielectric layer 120 is positioned between the semiconductor body 110 and the metal features 116. In some embodiments, the metal features 116 comprise metal, such as aluminum, copper, or other suitable material. In some embodiments, each metal feature 116 defines a ring-shaped or framing structure that surrounds the device region 102. For example, the innermost metal structure 116A contacts and/or overlaps the contact 114, thereby framing the contact 114. In some embodiments, one or more of the metal features 116 comprises a ring-shaped plate. The metal features 116 may be continuous, as illustrated in FIG. 1B, or the structure of the metal features 116 may be discontinuous, comprised of discrete conductive elements. The number of metal features 116 in the edge termination structure 106 may vary. Other structures and configurations of the metal feature 116 are within the scope of the present disclosure. In some embodiments, the metal feature 116 has a u-shaped cross-section, a rectangular cross-section, or a cross-section that conforms to the topology of the dielectric layer 120. For example, the dielectric layer may define one or more openings 122 (shown in phantom) that expose portions of the semiconductor body 110, and the metal feature 116 may extend into the opening(s) to contact the semiconductor body 110 and the doped feature 118. In some embodiments, the outermost metal feature 116 is part of a channel stopper structure.

In some embodiments, a high voltage may be applied to the outermost metal feature 116 and decreasing voltages may be applied to metal features 116 closer to the device region 102. For example, a voltage at or near the level of the breakthrough voltage for a device in the device region may be applied to the outermost metal feature 116, a voltage of 0V may applied to the innermost metal feature 116 and intermediate voltages may be applied to the intermediate metal features in a decreasing manner.

In some embodiments, the doped feature 118 comprises a variation of lateral doping (VLD) structure where the dopant concentration is greatest at the edge 108 of the edge termination region 104 decreases as it approaches the device region 102. The VLD structure may comprise one or more doped regions in the semiconductor body 110 with different spacing, different concentrations, or different sizes to achieve the VLD profile. In some embodiments, the doped feature 118 is counter-doped with respect to the base doping of the semiconductor body 110. For example, in an embodiment where the semiconductor body 110 is n-doped, a portion of the doped feature 118 is p-doped. The size, depth, and arrangement of the doped feature 118 may vary. The doped feature 118 may comprise multiple doped regions with different dopant dosages and/or different conductivity types.

In some embodiments, the dielectric layer 120 comprises silicon dioxide, silicon nitride, and/or other suitable materials. In some embodiments, the material(s) for the dielectric layer 120 comprises at least one of Si, O, C, N, or H, such as SiCOH, SiOC, oxygen-doped SiC (ODC), nitrogen-doped SiC (NDC), plasma-enhanced oxide (PEOX), and/or other suitable materials. Organic material, such as polymers, may be used for the dielectric layer 120. In some embodiments, the dielectric layer 120 comprises one or more layers of a carbon-containing material, organo-silicate glass, a porogen-containing material, and/or other suitable materials. The dielectric layer 120 may be formed by using, for example, at least one of atomic layer deposition (ALD), chemical vapor deposition (CVD), low pressure CVD (LPCVD), atomic layer chemical vapor deposition (AL-CVD), ultrahigh vacuum CVD (UHVCVD), reduced pressure CVD (RPCVD), plasma enhanced CVD (PECVD), or other suitable techniques. The dielectric layer 120 may comprise one or more layers, at least some of which may have a same material composition. Other structures and/or configurations of the dielectric layer 120 are within the scope of the present disclosure.

Figure 1C:
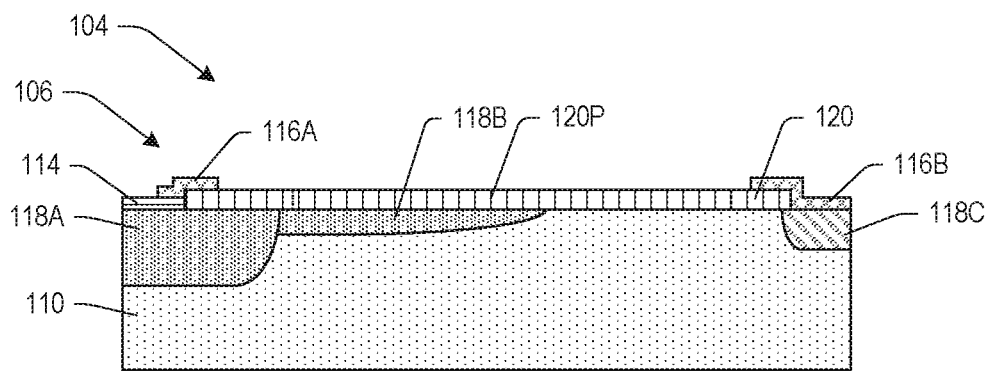
FIG. 1C is a cross-sectional view of edge termination structures, according to various examples.
Figure 1D:
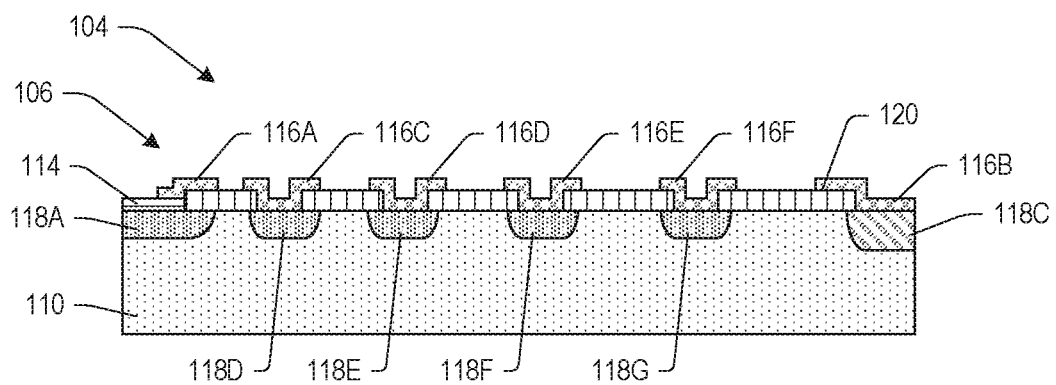
FIG. 1D is a cross-sectional view of edge termination structures, according to various examples.

FIGS. 1C and 1D are cross-section views of edge termination structures 106, according to various examples. FIG. 1C illustrates a VLD structure comprising metal features 116A, 116B and doped regions 118A, 118B, 118C. In some embodiments, the metal feature 116A frames the contact 114 and contacts the contact 114. In some embodiments, the metal feature 116B and the doped regions 118A, 118B, 118C comprise ring shaped structures. The doped regions 118A, 118B may have opposite conductivity types compared to the semiconductor body 110. The dopant concentration of the doped region 118B decreases as the distance from the contact 114 increases. The doped region 118C and the metal feature 116B define a channel stopper structure. The doped region 118C may have the same conductivity type or an opposite conductivity type as the semiconductor body 110. In some embodiments, a portion 120P of the dielectric layer 120 between the metal features 116A, 116B and delineated by phantom lines is removed and the upper surface of the semiconductor body 110 is exposed.

FIG. 1D illustrates a VLD structure comprising metal features 116A, 116B, 116C, 116D, 116E, 116F and doped regions 118A, 118C, 118D, 118E, 118F, 118G. In some embodiments, the metal feature 116A frames the contact 114 and contacts the contact 114. In some embodiments, the doped regions 118C, 118D, 118E, 118F are below openings in the dielectric layer 120 and the metal features 116C, 116D, 116E, 116F are in the openings and contact the doped regions 118C, 118D, 118E, 118F. In some embodiments, the metal features 116C, 116D, 116E, 116F and the doped regions 118A, 118C, 118D, 118E, 118F, 118G comprise ring shaped structures. The doped regions 118A, 118C, 118D, 118E, 118F, 118G may have opposite conductivity types compared to the semiconductor body 110. The spacing between the doped regions 118D, 118E, 118F, 118G may increase as the distance from the contact 114 increases. In some embodiments, the doped region 118C and the metal feature 116B define a channel stopper structure. The doped region 118C may have the same conductivity type or an opposite conductivity type as the semiconductor body 110.

Figure 2A:
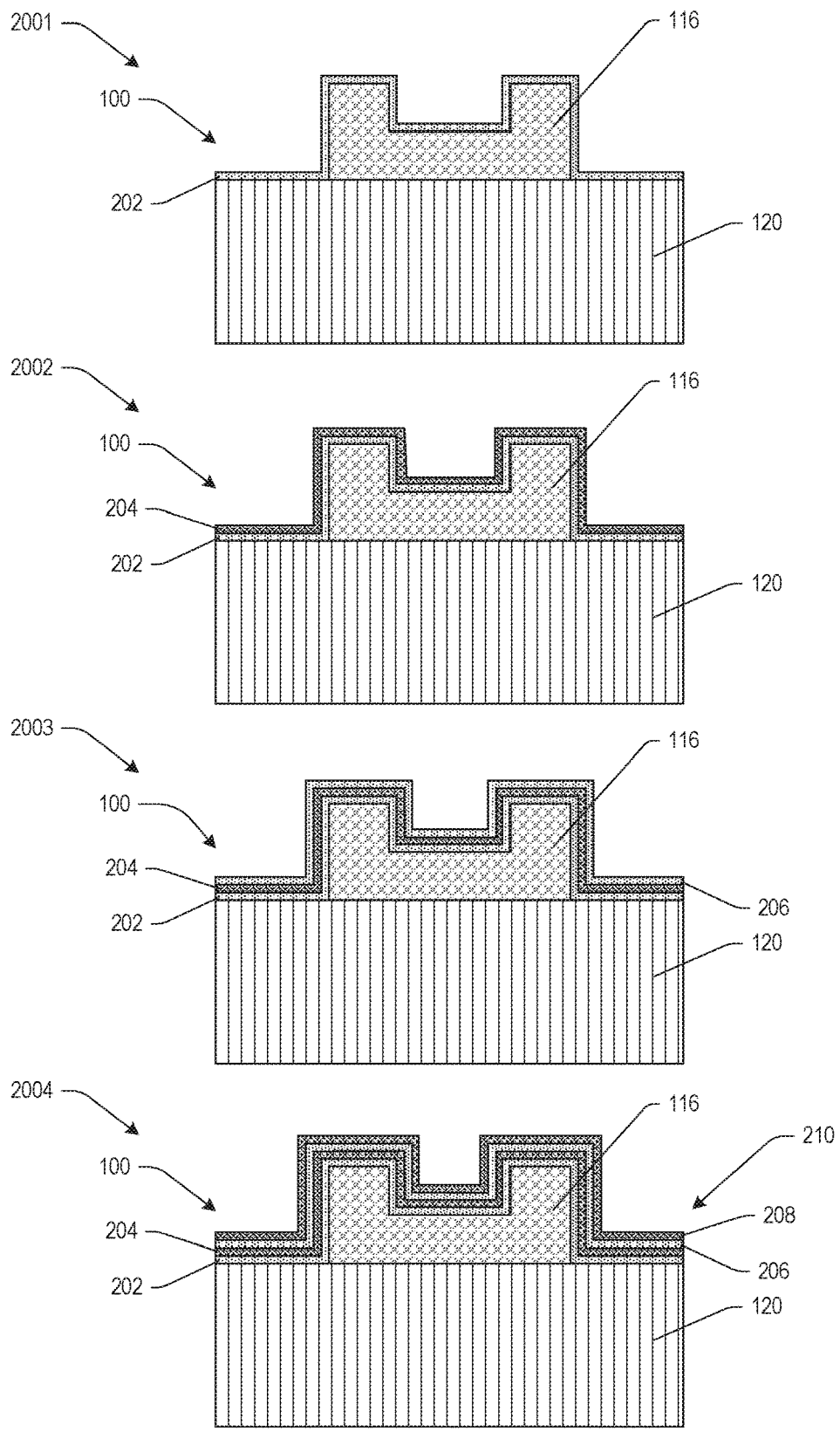
FIG. 2A schematically illustrates acts of manufacturing a semiconductor device according to various examples.
Figure 2B:
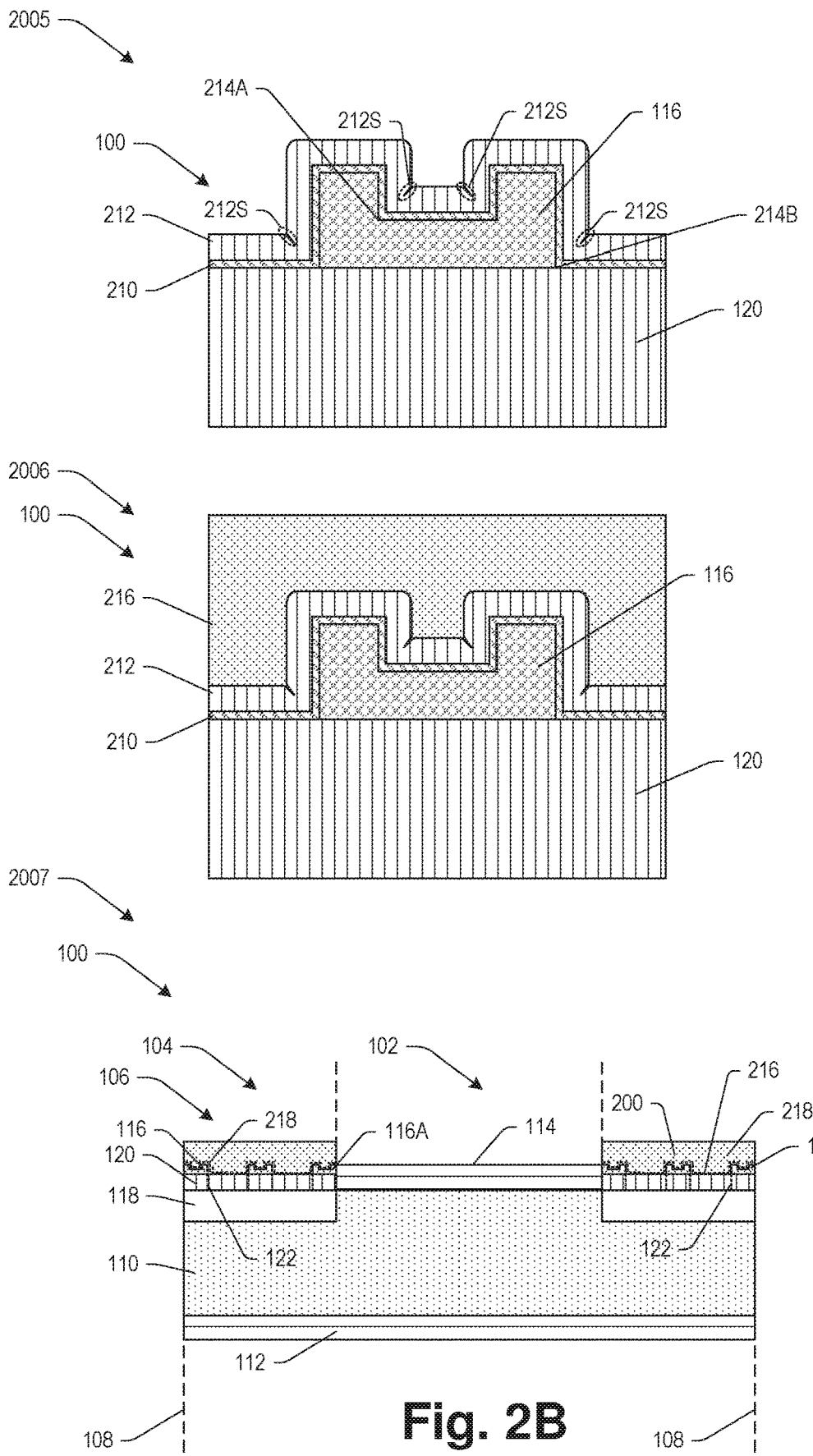
FIG. 2B schematically illustrates acts of manufacturing a semiconductor device according to various examples.

FIGS. 2A-2B illustrate aspects with respect to manufacturing the semiconductor device 100 according to various examples of the present disclosure. The views illustrated in FIGS. 2A-2B represent a portion 200 (see FIG. 1A) of the semiconductor device 100 including a metal feature 116.

At 2001 (illustrated in FIG. 2A), a conformal ion diffusion barrier layer 202 is formed over the metal feature 116. In some embodiments, the conformal ion diffusion barrier layer 202 serves to inhibit migration of the material of the metal feature 116, oxidized or reduced material of the metal feature 116, external contaminants, solvents, and/or other materials. In some embodiments, the conformal ion diffusion barrier layer 202 is formed by performing at least one of an atomic layer deposition (ALD) process, a pulsed CVD process, molecular vapor deposition, or some other suitable process. In some embodiments, a thickness of the conformal ion diffusion barrier layer 202 is at least about 1 nm and less than about 200 nm. In some embodiments, the conformal ion diffusion barrier layer 202 comprises aluminum oxide, aluminum nitride, tantalum nitride, or some other suitable material that inhibits migration of the material of the metal feature 116.

At 2002 (illustrated in FIG. 2A), a conformal chemical protection layer 204 is formed over the conformal ion diffusion barrier layer 202. In some embodiments, the conformal chemical protection layer 204 serves to protect the metal feature 116 from degradation from external agents, such as water (e.g., from elevated humidity), OH–, H$_3$O+, Na+, or some other degrading chemical agent. In some embodiments, the conformal chemical protection layer 204 is formed by performing an atomic layer deposition (ALD) process. In some embodiments, a thickness of the conformal chemical protection layer 204 is at least about 1 nm and less than about 200 nm. In some embodiments, the conformal chemical protection layer 204 comprises silicon dioxide, zirconium dioxide, titanium dioxide, hafnium dioxide, tantalum oxide, boron nitride, or some other suitable material that inhibits chemical degradation of the material of the metal feature 116 and/or the layer(s) underneath.

At 2003 (illustrated in FIG. 2A), a conformal ion diffusion barrier layer 206 is formed over the conformal chemical protection layer 204. In some embodiments, the conformal ion diffusion barrier layer 206 serves to inhibit migration of the material of the metal feature 116. In some embodiments, the conformal ion diffusion barrier layer 206 is a conformal layer formed by performing an atomic layer deposition (ALD) process. In some embodiments, a thickness of the conformal ion diffusion barrier layer 206 is at least about 1 nm and less than about 200 nm. In some embodiments, the conformal ion diffusion barrier layer 206 comprises aluminum oxide, aluminum nitride, tantalum nitride, or some other suitable material that inhibits migration of the material of the metal feature 116. In some embodiments, the material composition of the conformal ion diffusion barrier layer 206 is the same as the material composition of the conformal ion diffusion barrier layer 202.

At 2004 (illustrated in FIG. 2A), a conformal chemical protection layer 208 is formed over the conformal ion diffusion barrier layer 206. In some embodiments, the conformal chemical protection layer 208 serves to protect the metal feature 116 from degradation from external agents, such as water (e.g., from elevated humidity), OH−, $H_3O+$, Na+, or some other degrading chemical agent. In some embodiments, the chemical protection layer 208 is a conformal layer formed by performing an atomic layer deposition (ALD) process. In some embodiments, a thickness of the conformal chemical protection layer 208 is at least about 1 nm and less than about 200 nm. In some embodiments, the conformal chemical protection layer 208 comprises silicon dioxide, zirconium dioxide, titanium dioxide, hafnium dioxide, tantalum oxide, boron nitride, or some other suitable material that inhibits chemical degradation of the material of the metal feature 116. In some embodiments, the material composition of the conformal chemical protection layer 208 is the same as the material composition of the conformal chemical protection layer 204.

The conformal ion diffusion barrier layers 202, 206 and the conformal chemical protection layers 204, 208 define a stack 210 of conformal protective layers 202, 204, 206, 208. In some embodiments, the number of layers in the stack 210 of conformal protective layers 202, 204, 206, 208 may vary. The thicknesses of the individual conformal protective layers 202, 204, 206, 208 in the stack 210 may vary. In an embodiment where the stack 210 of conformal protective layers 202, 204, 206, 208 is formed using an ALD process, the conformal protection layers 202, 204, 206, 208 may be referred to as ALD layers 202, 204, 206, 208. An ALD layer differs structurally from layers formed using a different deposition process. For example, an ALD layer is highly conformal and exhibits an amorphous or crystalline state. Pinholes are suppressed in an ALD layer. The term ALD layer is intended to denote a physical structure as well as a technique for forming the conformal protection layer 202, 204, 206, 208. For example an ALD layer exhibits few to no seams at corners of the underlying topographical features.

At 2005 (illustrated in FIG. 2B), a conformal dielectric layer 212 is formed over the stack 210 of conformal protective layers 202, 204, 206, 208. For ease of illustration, the thicknesses of the conformal protective layers 202, 204, 206, 208 in the stack 210 relative to the size of the metal feature 116 as illustrated in FIG. 2A was exaggerated. In the illustration of FIG. 2B, the stack 210 is illustrated as a single layer. In some embodiments, the conformal dielectric layer 212 comprises silicon nitride and/or other suitable materials. In some embodiments, the conformal dielectric layer 212 comprises multiple layers having the same or different material compositions. For example, the conformal dielectric layer 212 may comprise a layer of silicon dioxide and a layer of silicon nitride. The conformal dielectric layer 212 is a mechanical stabilization layer for the metal feature 116 in the edge termination region.

The conformal dielectric layer 212 may be formed by using, for example, at least one of chemical vapor deposition (CVD), low pressure CVD (LPCVD), atomic layer chemical vapor deposition (ALCVD), ultrahigh vacuum CVD (UHVCVD), reduced pressure CVD (RPCVD), plasma enhanced CVD (PECVD), or other suitable techniques. The conformal dielectric layer 212 may comprise one or more layers, at least some of which may have a same material composition. Other structures and/or configurations of the conformal dielectric layer 212 are within the scope of the present disclosure.

In some cases, the conformal dielectric layer 212 has seams 212S over portions of the metal feature 116. For example, the seams 212S may be present where an inside corner 214A is defined in the metal feature 116 or where an inside corner 214B where the metal feature 116 interfaces with the dielectric layer 120. A seam 212S, if present, is a weak point in the protection provided to the metal feature 116 by the conformal dielectric layer 212. The stack 210 of conformal protective layers 202, 204, 206, 208 provides protection to the metal feature 116 and mitigates protection weaknesses arising from the seams 212S.

At 2006 (illustrated in FIG. 2B), a passivation layer 216 is formed over the conformal dielectric layer 212. In some embodiments, the passivation layer 216 is a polymer layer such as polyimide, benzocyclobutene (BCB), polybenzoxazole (PBO), an inorganic-organic hybrid material, such as ORMOCER®, or some other suitable passivation layer. The passivation layer 216 serves as a mechanical protection and stress buffer layer in the edge termination region 104. In some embodiments, a precursor of the passivation layer 216 is first deposited by spin coating and/or other suitable techniques.

At 2007 (illustrated in FIG. 2B), the passivation layer 216, the conformal dielectric layer 212, and the stack 210 of conformal protective layers 202, 204, 206, 208 are patterned to expose the contact 114. For ease of illustration, the stack 210 of conformal protective layers 202, 204, 206, 208 and the conformal dielectric layer 212 are illustrated as a single layer by the dashed line 218. In some embodiments, the passivation layer 216 is a photosensitive layer that can be patterned using photolithography techniques, such as coating, exposure, development, and/or other suitable processes. In some embodiments, the patterning of the passivation layer 216 defines an opening 220 over the contact 114. In some embodiments, a thermal curing process is performed on the passivation layer 216. In some embodiments, the patterned passivation layer 216 is used as an etch mask for removing portions of the stack 210 of conformal protective layers 202, 204, 206, 208 and the conformal dielectric layer 212 over the contact 114. Other structures and/or configurations of the passivation layer 216 are within the scope of the present disclosure. In some embodiments, multiple openings or different configurations of openings may be performed in the passivation layer 216, the stack 210 of conformal protective layers 202, 204, 206, 208, and/or the conformal dielectric layer 212. In some embodiments, such as the edge termination structure 106 illustrated in FIG. 1C where the portion 120P of the dielectric layer 120 is removed, the stack 210 of conformal protective layers 202, 204, 206, 208 and the conformal dielectric layer 212 represented by the dashed line 218 contacts the semiconductor body 110.

Figure 3:
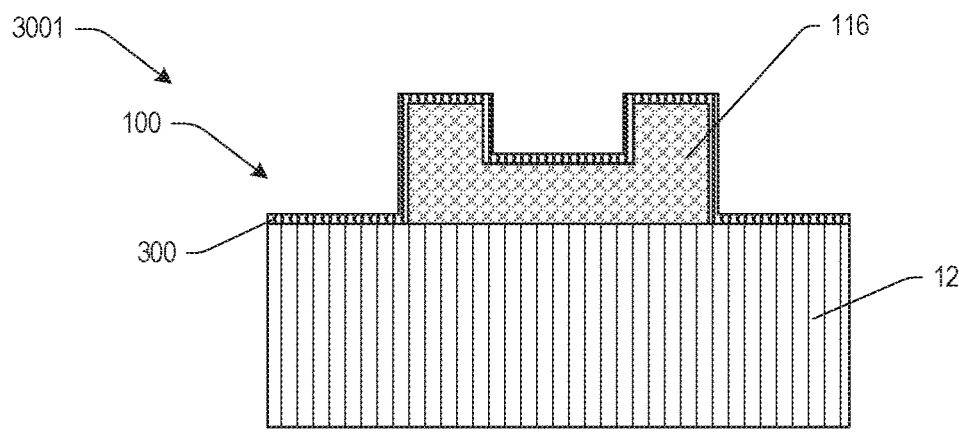
FIG. 3 schematically illustrates acts of manufacturing a semiconductor device according to various examples.
Figure 3:
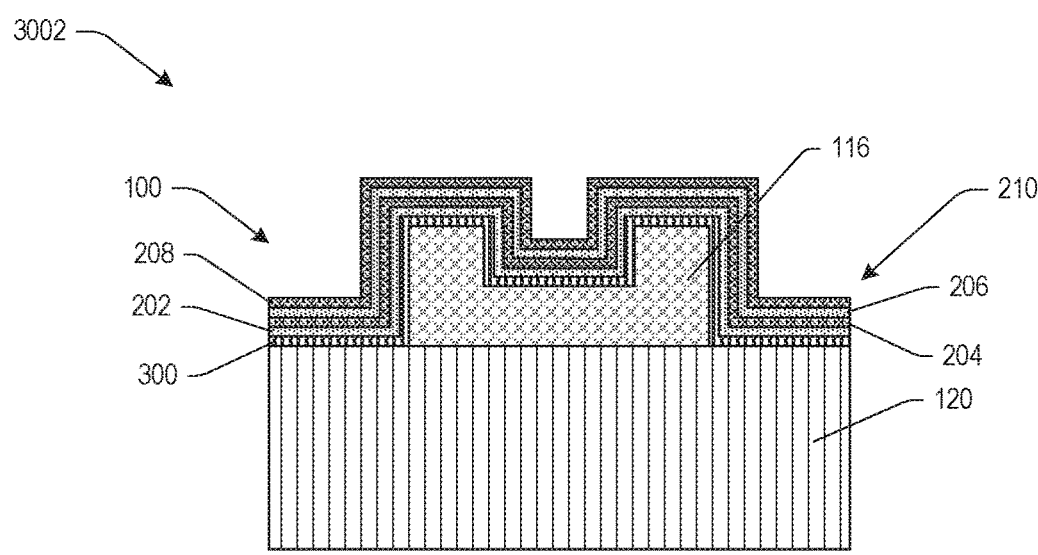

FIG. 3 illustrates aspects with respect to manufacturing a semiconductor device 100 according to various examples of the present disclosure. At 3001 (illustrated in FIG. 3), a conformal charge shielding layer 300 is formed over the metal feature 116. In some embodiments, the conformal charge shielding layer 300 serves to counter-balance external charges, which could have an influence on the electrical behavior of the edge termination. In some embodiments, the conformal charge shielding layer 300 is a conformal layer formed by performing an atomic layer deposition (ALD) process. In some embodiments, a thickness of the conformal charge shielding layer 300 is at least about 1 nm and less than about 200 nm. In some embodiments, the conformal charge shielding layer 300 comprises titanium dioxide or some other suitable charge shielding material.

At 3002 (illustrated FIG. 3), the acts 2001, 2002, 2003, 2004 illustrated an described in reference to FIG. 2A are performed to form the conformal protective layers 202, 204, 206, 208 over the conformal charge shielding layer 300, such that the stack 210 includes the conformal protective layers 300, 202, 204, 206, 208. In some embodiments, the acts 3001, 3002 illustrated in FIG. 2B are performed to form the conformal dielectric layer 212 and the passivation layer 216, and to pattern the opening 220.

Figure 4:
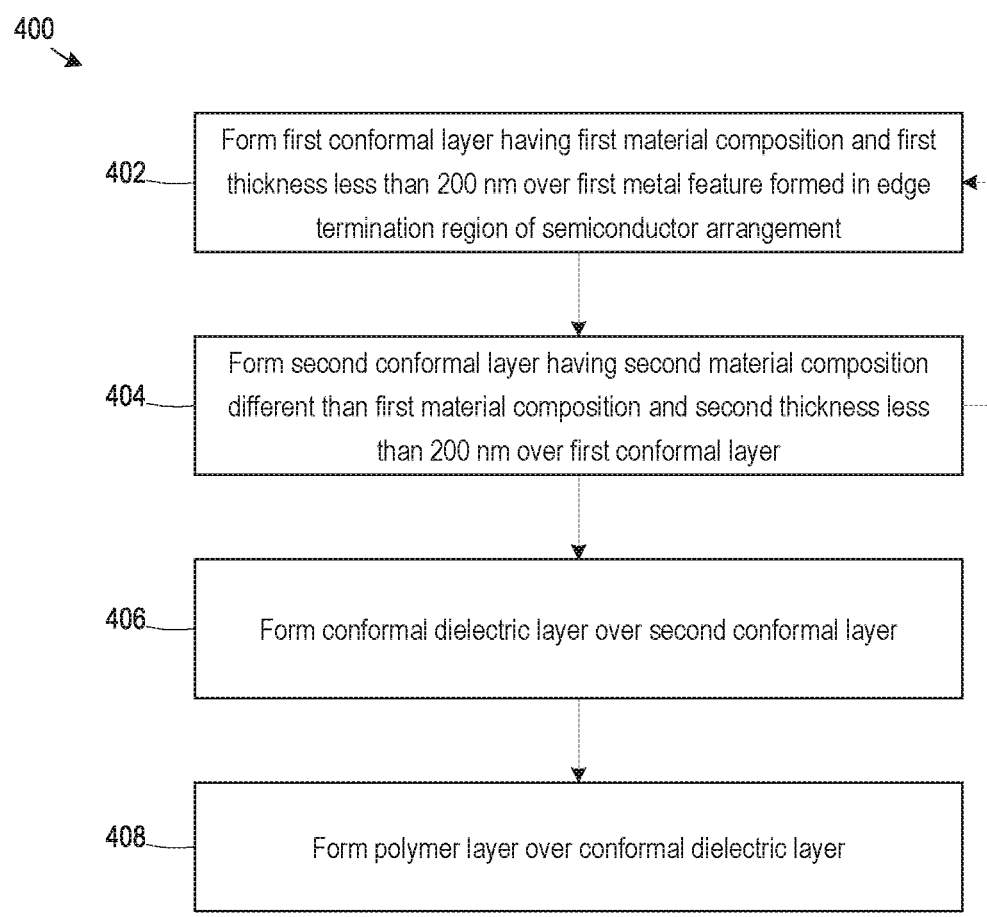
FIG. 4 is an illustration of an example method in accordance with the techniques presented herein.

FIG. 4 is an illustration of an example method 400 for manufacturing a semiconductor device 100. At 402, a first conformal layer having a first material composition and a first thickness less than 200 nm is formed over a first metal feature formed in an edge termination region of the semiconductor device. At 404, a second conformal layer having a second material composition different than the first material composition and a second thickness less than 200 nm is formed over the first conformal layer. In some embodiments, 402 and 404 are repeated to form a stack comprising multiple instances of the first conformal layer and the second conformal layer. At 406, a conformal dielectric layer is formed over the second conformal layer. At 408, a polymer layer is formed over the conformal dielectric layer.

It may be appreciated that by applying one or more of the techniques described herein, such as by forming a stack of conformal protective layers over a metal feature in an edge termination region, increases the reliability of the device by reducing the likelihood of damage from migration of the metal feature 116 or degradation from external agents. Increasing the reliability tends to increase performance, increase yield, and increase profitability.

According to some embodiments, a semiconductor device is provided. The semiconductor device comprises a device region, an edge termination region surrounding the device region, a first metal feature in the edge termination region, a first conformal ion diffusion barrier layer over the first metal feature, and a first conformal chemical protection layer over the first conformal ion diffusion barrier layer.

According to some embodiments, the semiconductor device comprises a dielectric layer over the first conformal chemical protection layer.

According to some embodiments, the semiconductor device comprises a polymer layer over the dielectric layer.

According to some embodiments, the polymer layer comprises at least one of polyimide, benzocyclobutene, polybenzoxazole, or an inorganic-organic hybrid material.

According to some embodiments, the dielectric layer comprises silicon nitride.

According to some embodiments, the first metal feature comprises a metal ring surrounding the device region.

According to some embodiments, the first metal feature comprises a field plate.

According to some embodiments, the semiconductor device comprises a second conformal ion diffusion barrier layer over the first conformal chemical protection layer and a second conformal chemical protection layer over the second conformal ion diffusion barrier layer.

According to some embodiments, the semiconductor device comprises a conformal charge shielding layer under the first conformal ion diffusion barrier layer and over the first metal feature.

According to some embodiments, a semiconductor device comprises a device region, an edge termination region adjacent the device region, a first metal feature in the edge termination region, a first atomic layer deposition layer having a first material composition over the first metal feature, and a second atomic layer deposition layer having a second material composition different than the first material composition over the first atomic layer deposition layer.

According to some embodiments, the semiconductor device comprises a dielectric layer over the second atomic layer deposition layer.

According to some embodiments, the semiconductor device comprises a polymer layer over the dielectric layer.

According to some embodiments, the polymer layer comprises at least one of a polyimide, benzocyclobutene, polybenzoxazole, or an inorganic-organic hybrid material.

According to some embodiments, the dielectric layer comprises silicon nitride.

According to some embodiments, the first metal feature comprises a metal ring surrounding the device region.

According to some embodiments, the semiconductor device comprises a third atomic layer deposition layer having the first material composition over the second atomic layer deposition layer and a fourth atomic layer deposition layer having the second material composition over the third atomic layer deposition layer.

According to some embodiments, the semiconductor device comprises a conformal charge shielding layer under the first atomic layer deposition layer and over the first metal feature.

According to some embodiments, a method for forming a semiconductor device comprises forming a first conformal layer having a first material composition and a first thickness less than 200 nm over a first metal feature formed in an edge termination region of the semiconductor device. A second conformal layer having a second material composition different than the first material composition and a second thickness less than 200 nm is formed over the first conformal layer. A conformal dielectric layer is formed over the second conformal layer.

According to some embodiments, the method comprises forming a polymer layer over the conformal dielectric layer.

According to some embodiments, forming the polymer layer comprises forming at least one of a polyimide layer, a benzocyclobutene layer, a polybenzoxazole layer, or an inorganic-organic hybrid material layer.

According to some embodiments, forming the conformal dielectric layer comprises forming a silicon nitride layer.

According to some embodiments, the first metal feature comprises a metal ring surrounding a device region of the semiconductor device.

According to some embodiments, the method comprises forming a third conformal layer having the first material composition over the second conformal layer and forming a fourth conformal layer having the second material composition over the third conformal layer.

According to some embodiments, the method comprises forming a conformal charge shielding layer under the first conformal layer and over the first metal feature.

According to some embodiments, forming the first conformal layer comprises performing an atomic layer deposition process to form the first conformal layer.

According to some embodiments, forming the first conformal layer comprises performing a pulsed chemical vapor deposition process to form the first conformal layer.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A semiconductor device, comprising:
a semiconductor body;
a device region in the semiconductor body;
an edge termination region in the semiconductor body surrounding the device region;
a first metal feature in the edge termination region;
a conformal charge shielding layer over the first metal feature;
a first conformal ion diffusion barrier layer over the conformal charge shielding layer comprising a first material that inhibits migration of a second material of the first metal feature; and
a first conformal chemical protection layer over the first conformal ion diffusion barrier layer.

2. The semiconductor device of claim 1, comprising:
a dielectric layer over the first conformal chemical protection layer.

3. The semiconductor device of claim 2, comprising:
a polymer layer over the dielectric layer.

4. The semiconductor device of claim 3, wherein:
the polymer layer comprises at least one of polyimide, benzocyclobutene, polybenzoxazole, or an inorganic-organic hybrid material.

5. The semiconductor device of claim 2, wherein:
the dielectric layer comprises silicon nitride.

6. The semiconductor device of claim 2, wherein:
the dielectric layer comprises a conformal dielectric layer.

7. The semiconductor device of claim 1, wherein:
the first metal feature comprises a metal ring surrounding the device region.

8. The semiconductor device of claim 1, wherein:
the first metal feature comprises a field plate.

9. The semiconductor device of claim 1, comprising:
a second conformal ion diffusion barrier layer over the first conformal chemical protection layer; and
a second conformal chemical protection layer over the second conformal ion diffusion barrier layer.

10. A semiconductor device, comprising:
a semiconductor body;
a device region in the semiconductor body;
an edge termination region in the semiconductor body adjacent the device region;
a first metal feature in the edge termination region;
a conformal charge shielding layer over the first metal feature;
a first atomic layer deposition layer over the conformal charge shielding layer and having a first material composition that inhibits migration of a material of the first metal feature; and
a second atomic layer deposition layer having a second material composition different than the first material composition over the first atomic layer deposition layer.

11. The semiconductor device of claim 10, comprising:
a dielectric layer over the second atomic layer deposition layer.

12. The semiconductor device of claim 11, comprising:
a polymer layer over the dielectric layer.

13. The semiconductor device of claim 12, wherein:
the polymer layer comprises at least one of a polyimide, benzocyclobutene, polybenzoxazole, or an inorganic-organic hybrid material.

14. The semiconductor device of claim 11, wherein:
the dielectric layer comprises silicon nitride.

15. The semiconductor device of claim 11, wherein:
the dielectric layer comprises a conformal dielectric layer.

16. The semiconductor device of claim 10, wherein:
the first metal feature comprises a metal ring surrounding the device region.

17. The semiconductor device of claim 10, comprising:
a third atomic layer deposition layer having the first material composition over the second atomic layer deposition layer; and
a fourth atomic layer deposition layer having the second material composition over the third atomic layer deposition layer.

18. A method for forming a semiconductor device, comprising:
forming a conformal charge shielding layer over a first metal feature formed in an edge termination region of a semiconductor body, of the semiconductor device, comprising a device region and the edge termination region, wherein the edge termination region surrounds the device region;
forming a first conformal ion diffusion barrier layer comprising a first material over the conformal charge shielding layer, wherein the first material inhibits migration of a second material of the first metal feature;
forming a first conformal chemical protection layer over the first conformal ion diffusion barrier layer; and
forming a conformal dielectric layer over the first conformal chemical protection layer.

19. The method of claim 18, comprising:
forming a polymer layer over the conformal dielectric layer.

20. The method of claim 19, wherein forming the polymer layer comprises:
forming at least one of a polyimide layer, a benzocyclobutene layer, a polybenzoxazole layer, or an inorganic-organic hybrid material layer.

21. The method of claim 18, wherein forming the conformal dielectric layer comprises:
forming a silicon nitride layer.

22. The method of claim 18, wherein:
the first metal feature comprises a metal ring surrounding the device region of the semiconductor device.

23. The method of claim 18, comprising:
forming a second conformal ion diffusion barrier layer having the first material over the first conformal chemical protection layer; and
forming a second conformal chemical protection layer over the second conformal ion diffusion barrier layer.

24. The method of claim 18, wherein forming the first conformal ion diffusion barrier layer comprises:
performing an atomic layer deposition process to form the first conformal ion diffusion barrier layer.

25. The method of claim 18, wherein forming the first conformal ion diffusion barrier layer comprises:
performing a pulsed chemical vapor deposition process to form the first conformal ion diffusion barrier layer.

26. The method of claim 18, wherein:
the first conformal ion diffusion barrier layer has a thickness less than 200 nm; and
the first conformal chemical protection layer has a thickness less than 200 nm.

* * * * *